(12) United States Patent
Liu

(10) Patent No.: US 7,646,227 B2
(45) Date of Patent: Jan. 12, 2010

(54) DIGITAL PHASE DISCRIMINATOR

(75) Inventor: Feng-Ming Liu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 157 days.

(21) Appl. No.: 11/781,077

(22) Filed: Jul. 20, 2007

(65) Prior Publication Data

US 2009/0021281 A1 Jan. 22, 2009

(51) Int. Cl.
*H03L 7/06* (2006.01)

(52) U.S. Cl. .......................... 327/159; 327/3

(58) Field of Classification Search ............ 327/3, 327/5, 7, 150, 159
See application file for complete search history.

(56) References Cited

U.S. PATENT DOCUMENTS 6,766,154 B2  7/2004  Humes et al. ............... 455/260
7,199,672 B2*  4/2007  Munker et al. ............... 331/16
2005/0207522 A1*  9/2005  Lindner et al. ............... 375/376

OTHER PUBLICATIONS

Liu, Lechang et al., "Reduced Pull-in Time of Phase-locked Loops with a Novel Nonlinear Phase-frequency Detector", APMC2005 Proceedings, IEEE01607060.
Yang, Ching-Yuan et al., Fast-Switching Frequency Synthesizer with a Discriminator-Aided Phase Detector, IEEE Journal of Solid-State Circuits, vol. 35, No. 10, Oct. 2000, pp. 1445-1452.

* cited by examiner

*Primary Examiner*—Lincoln Donovan
*Assistant Examiner*—Ryan C Jager
(74) *Attorney, Agent, or Firm*—K&L Gates LLP

(57) ABSTRACT

A phase discriminator for being used in a phase-locked loop to determine if a phase difference between a reference signal and a target signal has reached a programmable gap value is disclose which comprises a programmable phase gap selector receiving the reference signal, a first phase digital converter converting an output signal from the programmable phase gap selector to a first digital code, a second phase digital converter converting a phase difference between the target signal and the reference signal to a second digital code, and a code comparator comparing the first and second digital code and generating a first instructional signal based on a change of order of the values of the first and second digital code.

17 Claims, 4 Drawing Sheets

DIGITAL PHASE DISCRIMINATOR

BACKGROUND

The present invention relates generally to phase detection circuits, and, more particularly, to a digital phase discriminator.

Phase discriminators which respond to the phase difference between two signals have wide applications in wireless communication systems. For instance, in a fast switching phase-locked loop (PLL), the phase discriminator can be used to optimize the loop bandwidth. In the PLL, for minimizing noise, the loop bandwidth should be as narrow as possible. For fast channel switching and settling, the loop bandwidth needs to be large enough to facilitate the frequency switching. However, wider loop bandwidth results in poor reference spur cancellation. To accommodate these contradictory requirements in the PLL, a loop bandwidth booster is often used. During a frequency acquisition and tracking, where the PLL's output frequency and a reference frequency have a large difference, the loop bandwidth booster is turned on, so that the PLL has wider loop bandwidth. When the PLL's output frequency fall into a close range of the reference frequency, the loop bandwidth booster will be turned off.

The loop bandwidth booster control is conventionally realized by analogue circuits, such as using multiple phase-frequency-detectors and charge-pumps, or by a hybrid of analog and digital circuits. One problem with the conventional implementation is that they cannot distinguish phase differences between a reference signal and the PLL's output signal very precisely. Another problem, associated with the analogue circuits, is that when a process for manufacturing the PLL migrates to a different node, the loop bandwidth booster control circuit will be redesigned to be optimized for the new process.

As such, what is needed is a phase discriminator that can finely detect phase differences and is independent of process migrations. The phase discriminator can be used to control the aforementioned loop bandwidth booster as well as in many other applications.

SUMMARY

In view of the foregoing, the present invention provides a phase discriminator circuit for being used in a phase-locked loop to determine if a phase difference between a reference signal and a target signal has reached a programmable gap value. In one aspect of the present invention, the phase discriminator circuit comprises a programmable phase gap selector receiving the reference signal, a first phase digital converter converting an output signal from the programmable phase gap selector to a first digital code, a second phase digital converter converting a phase difference between the target signal and the reference signal to a second digital code, and a code comparator comparing the first and second digital code and generating a first instructional signal based on a change of order of the values of the first and second digital code.

In another aspect of the present invention, the phase discriminator circuit further comprises a signal confirmation module to determine if the code comparator has consistently detected a change of order of the values of the first and second digital code before releasing a second instructional signal.

The construction and method of operation of the invention, however, together with additional objects and advantages thereof will be best understood from the following description of specific embodiments when read in connection with the accompanying drawings.

Figure 1:
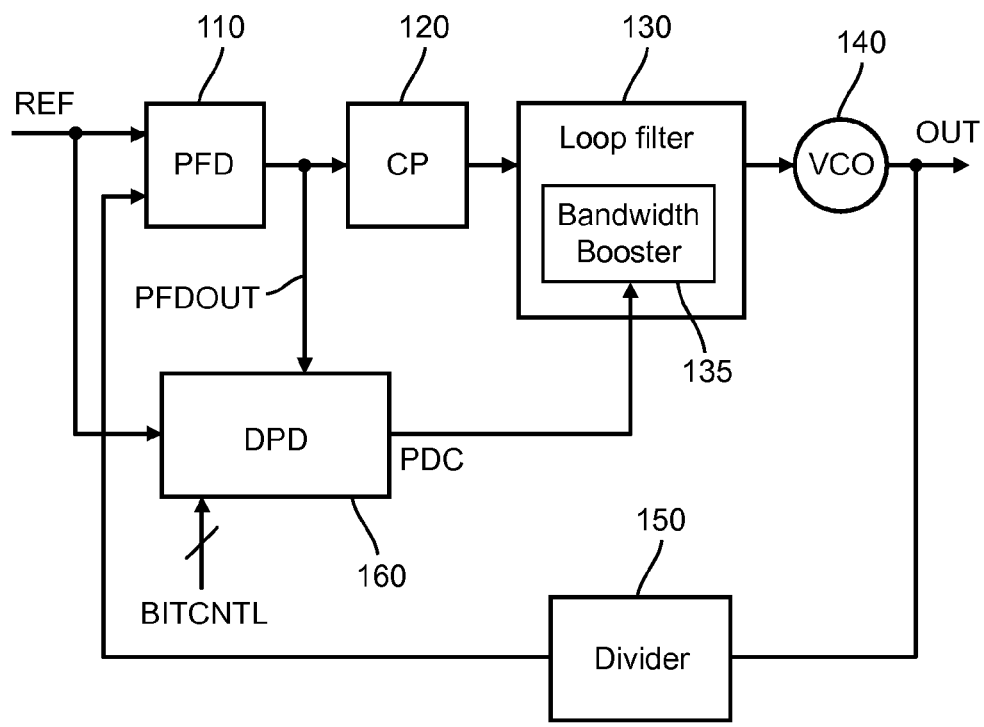
FIG. 1 is a block diagram illustrating a phase-locked-loop (PLL) circuit employing a digital-phase discriminator (DPD).

The drawings accompanying and forming part of this specification are included to depict certain aspects of the invention. A clearer conception of the invention, and of the components and operation of systems provided with the invention, will become more readily apparent by referring to the exemplary, and therefore non-limiting, embodiments illustrated in the drawings, wherein like reference numbers (if they occur in more than one view) designate the same elements. The invention may be better understood by reference to one or more of these drawings in combination with the description presented herein. It should be noted that the features illustrated in the drawings are not necessarily drawn to scale.

DESCRIPTION

The following will provide a detailed description of a digital phase discriminator that can distinguish a small amount of phase difference. A threshold of the phase difference is adjustable. Besides, the proposed digital phase discriminator is independent of process migrations.

FIG. 1 is a block diagram illustrating a phase-locked-loop (PLL) circuit employing a digital-phase discriminator (DPD). A PLL is an electronic control system that generates a signal that is locked to the phase of an input or "reference" (REF) signal. PLLs are generally built of a phase frequency detector (PFD) 110, a charge pump (CP) 120, a loop filter 130, a voltage controlled oscillator (VCO) 140 in a negative feedback configuration. There may be a frequency divider 150 in the feedback path in order to make the PLL's OUT signal clock an integer multiple of the REF signal.

Referring again to FIG. 1, the VCO 140 generates a periodic OUT signal, whose frequency is controlled by and usually proportional to an input control voltage. Assume that initially the VCO 140 is at nearly the same frequency as the REF signal. Then, if the phase from the oscillator falls behind that of the REF signal, the PFD 110 causes the charge pump 120 to change the control voltage, so that the VCO 140 speeds up. Likewise, if the OUT phase creeps ahead of the REF phase, the PFD 110 causes the charge pump 120 to change the control voltage to slow down the VCO 140. The loop filter 130 smoothes out the abrupt control inputs from the charge pump 120. If initially the OUT frequency is far from the REF frequency, the PFD 110 may also respond to frequency differences, so as to increase the lock-in range of allowable inputs.

Referring again to FIG. 1, in order to allow fast convergence of the OUT frequency and the REF frequency, the loop filter 130 employs a bandwidth booster 135. The bandwidth booster 135 is turned on when the frequency difference between the OUT and REF signal is larger than a predetermined threshold which is set by a digital phase discriminator (DPD) 160, and the bandwidth booster 135 is turned off when the frequency difference becomes smaller than the predetermined threshold. The DPD 160 detects phase difference of two input signals, REF and PFDOUT which is an output of the PFD 110. A setting signal, BITCNTL, is used to adjust the predetermined threshold. The PDP 160 produce an output signal, PDC, for turning the bandwidth booster 135 on of off.

Figure 2:
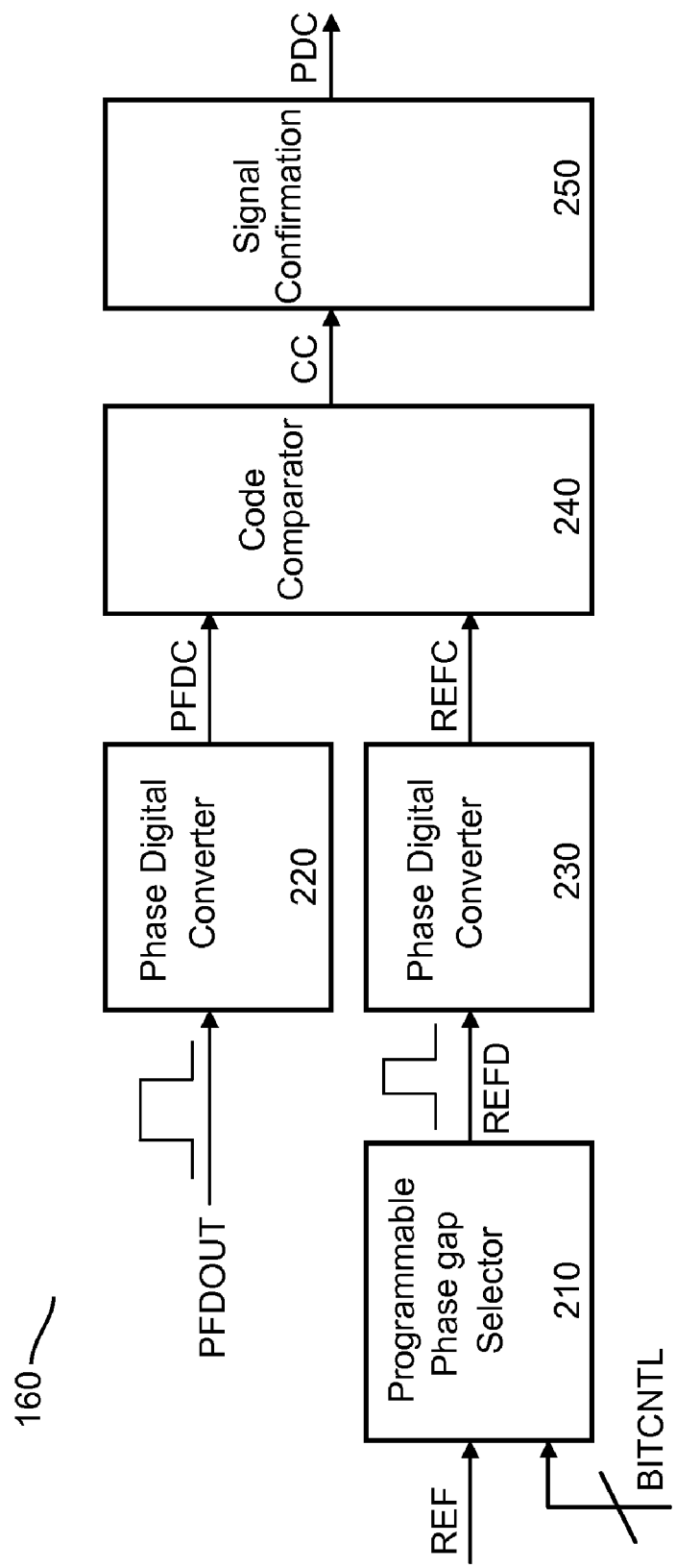
FIG. 2 is a block diagram illustrating an implementation of the DPD of FIG. 1 according to one embodiment of the present invention.

FIG. 2 is a block diagram illustrating an implementation of the DPD 160 of FIG. 1 according to one embodiment of the present invention. The DPD 160 comprises a programmable phase gap selector 210, two phase digital converters 220 and 230, a code comparator 240 and a signal confirmation module 250. The programmable phase gap selector 210 functions as an adjustable threshold phase gap setting device. The threshold phase gap is a phase difference between the REF and OUT signals below which the bandwidth booster 135 will still be engaged (turned on) for faster phase convergence, and above which the bandwidth booster 135 will be turned off for minimizing noises. Apparently the threshold phase gap should be able to be adjusted finely and small enough. An implementation of the programmable phase gap selector 210 as described hereinafter allows the digital phase discriminator 160 to be just like that.

Referring back to FIG. 2, the signal PFDOUT is a pulsed signal with a pulse width proportional to the phase difference between the REF and OUT signals. The programmable phase gap selector 210 takes in the REF signal as a reference, and produces a pulsed signal, REFD. A pulse width of the REFD signal is proportional to the threshold phase gap. The signal PFDOUT is also a pulsed signal with a pulse width proportional to the phase difference between the REF and OUT signal. Then both the PFDOUT and REFD signal are converted to digital codes, PFDC and REFC, respectively, by phase digital converters 220 and 230, respectively. The digital codes PFDC and REFC are compared by the code comparator 240. If the code PFDC is higher than the code REFC, the code comparator 240 will not output any instructional signal. Once the code PFDC becomes smaller than the code REFC, the code comparator 240 will output an instructional signal CC for turning off the bandwidth booster 135 of FIG. 1. Here, the digital codes PFDC and REFC may be thermal codes. The thermal code is a kind of code that numbers are increased by adding a "1" to a higher order bit, e.g., 0001, 0011, 0111, 1111, like a linear thermometer. Apparently, the thermal code is easy for comparing.

Referring back to FIG. 2, the instructional signal CC is actually sent to a signal confirmation module 250 before being sent to the bandwidth booster 135 of FIG. 1. The signal confirmation module 250 is to confirm that the instructional signal CC is repeatedly appeared at the output of the code comparator 240, i.e., the phase difference between the REF and OUT signals are indeed smaller than the pre-set phase threshold, and the instruction signal CC are not created by accidental noises. The signal confirmation module 250 may be implemented by a counter (not shown). Then in the case, the CC signal from the code comparator is a pulse signal with a predetermined frequency. When the counter counts up to a pre-set number, the counter will output the PDC signal for turning off the bandwidth booster 135 of FIG. 1. Any times before reaching the pre-set number, the CC pulse signal has stopped, the counter will be reset. Therefore, the previous CC pulse signals are treated as noise-induced signals. Apparently, a skilled artisan may implement the signal confirmation module 250 by many other means.

Figure 3:
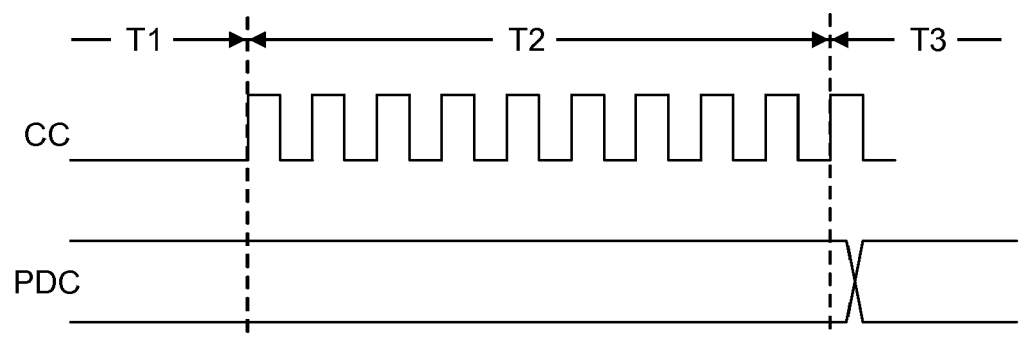
FIG. 3 is a timing wave form illustrating an operation of a counter serving as a signal confirmation circuit of FIG. 2.

FIG. 3 is a timing wave form illustrating an operation of the counter serving as the signal confirmation module of FIG. 2. During a T1 time period, no instructional signal CC is generated by the code comparator 240. During a T2 time period, the code comparator 240 start generating a pulsed instructional signal CC, which causes the counter to count up, or count down. When a pre-set number is reached, the counter will produce a switching signal PDC at the onset of a T3 time period. The switching signal PDC is used to turn of the bandwidth booster 135 of FIG. 1.

Figure 4:
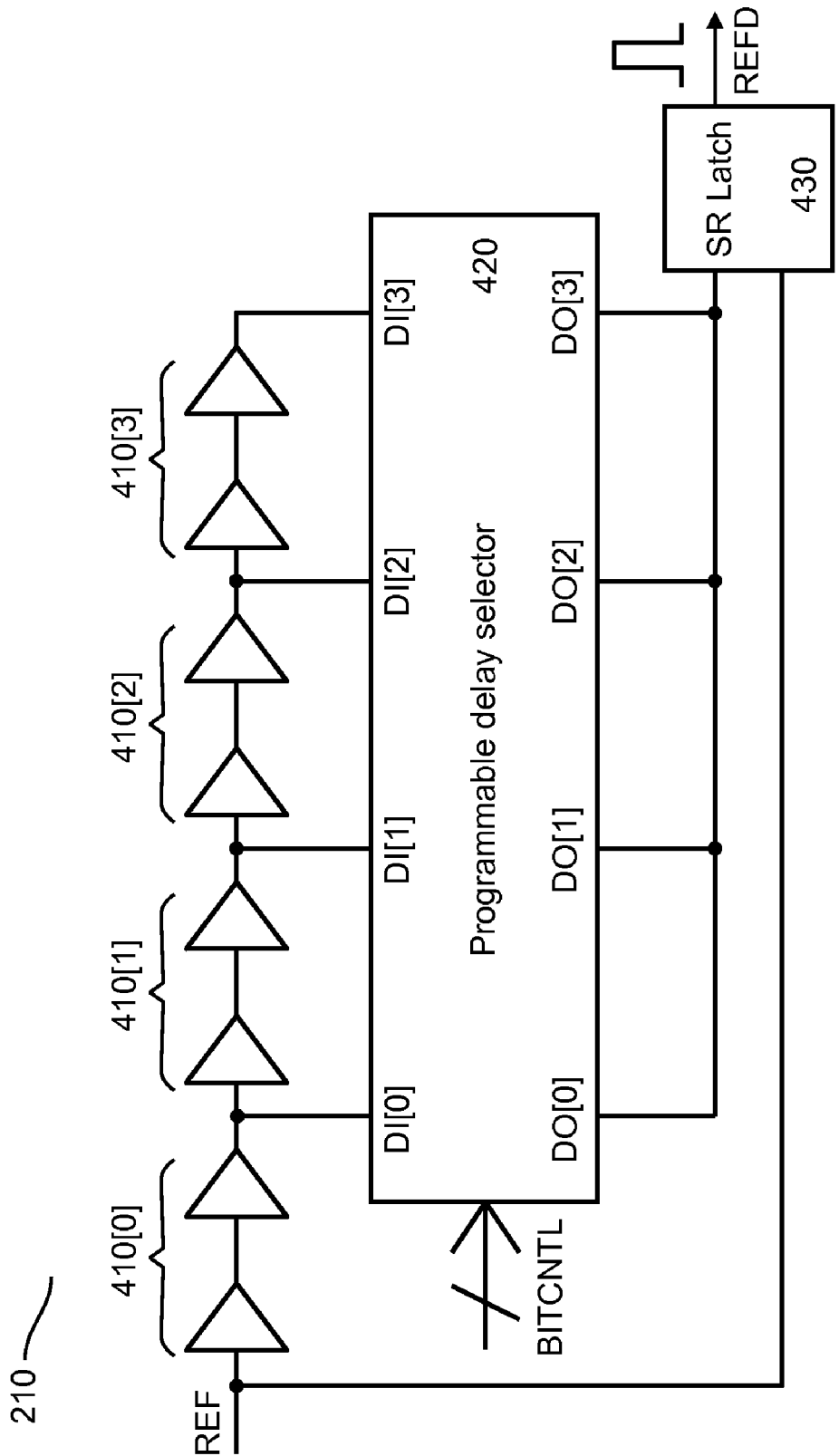
FIG. 4 is a block diagram illustrating an implementation of a programmable phase gap selector of FIG. 2 according to another embodiment of the present invention.

FIG. 4 is a block diagram illustrating an implementation of the programmable phase gap selector 210 of FIG. 2 according to another embodiment of the present invention. The programmable phase gap selector 210 has a delay chain with a series of delay units 410[0:3], a programmable delay selector 420 and a SR latch 430. The delay units 410[0:3] may be formed from active gates (shown in FIG. 4) or passive elements. Although only four stages of the delay units 410[0:3] are illustrated in FIG. 4, a skilled artisan would realize that the number of stages can be expanded or shrunken to other numbers for their respective applications.

The programmable delay selector 420 takes in various delays at its input terminals DI[0:3]. The setting signal, BITCNTL, determines which delay will be activated at the output terminals DO[0:3]. The SR latch 430 combines the original and the delayed REF signals to form the signal REFD with a desired pulse width.

Although, in above descriptions, phase differences are used, one having skill in the art would recognize that phase and frequency are two terms that can be used interchangeably here. When a frequency difference is smaller than a clock cycle, a phase difference is used for detection. Otherwise, the frequency difference itself is used for detection.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A phase discriminator, comprising:
   a programmable phase gap selector receiving a reference signal;
   a first phase digital converter converting an output signal from the programmable phase gap selector to a first digital code;
   a second phase digital converter converting a phase difference between a target signal and the reference signal to a second digital code, wherein both the first and second digital code are thermal code; and
   a code comparator comparing the first and second digital code and generating a first instructional signal based on a change of order of the values of the first and second digital code.

2. The phase discriminator of claim 1, wherein the programmable phase gap selector comprises:
   a delay chain coupled to the reference signal supplying a plurality of delayed reference signals with different delays;
   a programmable delay selector selecting at least one of delayed reference signals; and a latch generating a pulse signal based on both the reference signal and the selected delayed reference signal, the pulse signal being the output signal from the programmable phase gap selector.

3. The phase discriminator of claim 1 further comprises a signal confirmation module receiving the first instructional signal from the code comparator and generating a confirmed second instructional signal.

4. The phase discriminator of claim 3, wherein the signal confirmation module comprises a programmable counter with the first instructional signal being a pulse signal with a predetermined pulse width.

5. The phase discriminator of claim 3, wherein the second instructional signal is an on-and-off switching signal.

6. The phase discriminator of claim 1, wherein the change of order of the values of the first and second digital code is selected from the group consisting of a change from the first code larger than the second code to the first code smaller than the second code and a change from the first code smaller than the second code to the first code larger than the second code.

7. The phase discriminator of claim 1, wherein the target signal is generated by a phase-locked loop tracking the reference signal.

8. A phase discriminator, comprising:
a programmable phase gap selector receiving a reference signal;
a first phase digital converter converting an output signal from the programmable phase gap selector to a first digital code;
a second phase digital converter converting a phase difference between a target signal and the reference signal to a second digital code;
a code comparator comparing the first and second digital code and generating a first instructional signal based on a change of order of the values of the first and second digital code; and
a signal confirmation module receiving the first instructional signal from the code comparator and generating a confirmed second instructional signal, wherein the signal confirmation module comprises a programmable counter with the first instructional signal being a pulse signal with a predetermined pulse width.

9. The phase discriminator of claim 8, wherein the programmable phase gap selector comprises:
a delay chain coupled to the reference signal supplying a plurality of delayed reference signals with different delays;
a programmable delay selector selecting at least one of the delayed reference signals; and
a latch generating a pulse signal based on both the reference signal and the selected delayed reference signal, the pulse signal being the output signal from the programmable phase gap selector.

10. The phase discriminator of claim 8, wherein both the first and second digital code are thermal code.

11. The phase discriminator of claim 8, wherein the second instructional signal is an on-and-off switching signal.

12. The phase discriminator of claim 8, wherein the change of order of the values of the first and second digital code is selected from the group consisting of a change from the first code larger than the second code to the first code smaller than the second code and a change from the first code smaller than the second code to the first code larger than the second code.

13. The phase discriminator of claim 8, wherein the target signal is generated by a phase-locked loop tracking the reference signal.

14. A method for determining if a phase difference between a reference signal and a target signal has reached a programmable gap value, the method comprising:
transferring the programmable gap value to a predetermined pulse width of a pulse signal;
converting the pulse signal to a first digital code;
converting the phase difference to a second digital code;
comparing the first and second digital code; and
generating a first instructional signal upon a change of order of values of the first and second digital code, wherein both the first and second digital code are thermal code.

15. The method of claim 14 further comprising confirming the change of order being consistent before releasing a second instructional signal.

16. The method of claim 14, wherein the transferring comprises:
generating a plurality of delayed signals from the reference signal;
selecting one of the delayed signals;
creating the pulse signal based on the reference signal and the selected delayed signal.

17. The method of claim 14, wherein the transferring comprises:
generating a plurality of delayed signals from the reference signal;
selecting one of the delayed signals;
creating the pulse signal based on the reference signal and the selected delayed signal.

* * * * *